US012543274B2

(12) United States Patent
Sapozhnikov et al.

(10) Patent No.: US 12,543,274 B2
(45) Date of Patent: Feb. 3, 2026

(54) CAVITY BASED POWER DELIVERY AND DECOUPLING

(71) Applicant: Cisco Technology, Inc., San Jose, CA (US)

(72) Inventors: Mike Sapozhnikov, San Jose, CA (US); Sayed Ashraf Mamun, San Jose, CA (US); D. Brice Achkir, Livermore, CA (US); David Nozadze, San Jose, CA (US); Amendra Koul, San Francisco, CA (US); Upen Reddy Kareti, Union City, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 265 days.

(21) Appl. No.: 17/942,711

(22) Filed: Sep. 12, 2022

(65) Prior Publication Data

US 2023/0397343 A1 Dec. 7, 2023

Related U.S. Application Data

(60) Provisional application No. 63/349,690, filed on Jun. 7, 2022.

(51) Int. Cl.
*H05K 3/46* (2006.01)
*H05K 3/00* (2006.01)

(52) U.S. Cl.
CPC ......... *H05K 3/4697* (2013.01); *H05K 3/0047* (2013.01)

(58) Field of Classification Search
CPC ............... H05K 3/4697; H05K 3/0047

USPC ......................................... 174/250
See application file for complete search history.

(56) References Cited

U.S. PATENT DOCUMENTS

| 6,388,207 | B1 * | 5/2002 | Figueroa | H05K 1/115 |
| | | | | 257/E23.079 |
| 9,520,462 | B1 | 12/2016 | Tran et al. | |
| 2002/0071256 | A1 | 6/2002 | Figueroa et al. | |
| 2007/0085648 | A1 * | 4/2007 | Lee | H10D 1/20 |
| | | | | 336/200 |
| 2007/0221612 | A1 * | 9/2007 | Yamazaki | G11B 5/3163 |
| | | | | 216/22 |
| 2010/0207244 | A1 * | 8/2010 | Terui | H01L 23/49589 |
| | | | | 257/532 |
| 2013/0278610 | A1 * | 10/2013 | Stephanou | H01P 7/06 |
| | | | | 333/231 |
| 2015/0340425 | A1 | 11/2015 | We et al. | |
| 2018/0358292 | A1 | 12/2018 | Kong et al. | |

(Continued)

OTHER PUBLICATIONS

David (Donhang) Liu, et al., "Some Aspects of the Failure Mechanisms in BaTiO3-Based Multilayer Ceramic Capacitors," CARTS International, Mar. 26-29, 2012, 13 pages.

(Continued)

*Primary Examiner* — Andargie M Aychillhum
(74) *Attorney, Agent, or Firm* — Edell, Shapiro & Finnan, LLC

(57) ABSTRACT

The techniques described herein relate to an apparatus including: a support structure of an integrated circuit device; and an elongated cavity formed in the support structure of the integrated circuit device, wherein an interior of the elongated cavity is plated with a conductive material separated into a first power connection portion and a first ground connection portion.

20 Claims, 13 Drawing Sheets

(56) References Cited

U.S. PATENT DOCUMENTS

2020/0227400 A1\* 7/2020 Hisada .................... H01L 24/83
2020/0339414 A1\* 10/2020 Gul ....................... B81B 7/0009
2021/0399404 A1\* 12/2021 Lan .......................... C03C 4/04

OTHER PUBLICATIONS

PCB007 Magazine, Oct. 2021, 110 pages.

\* cited by examiner

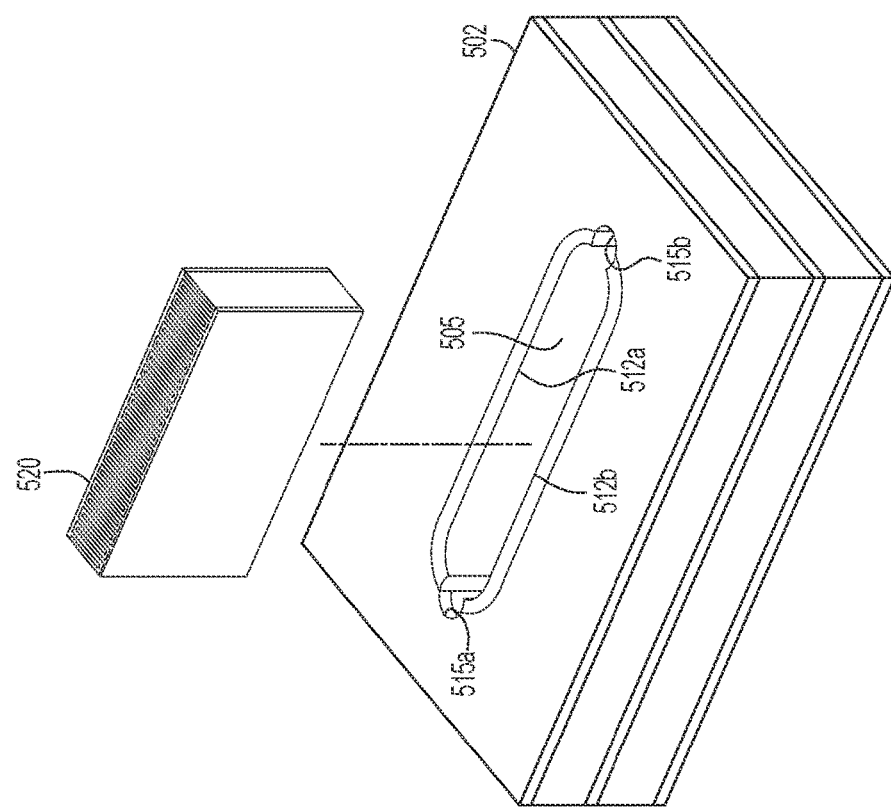
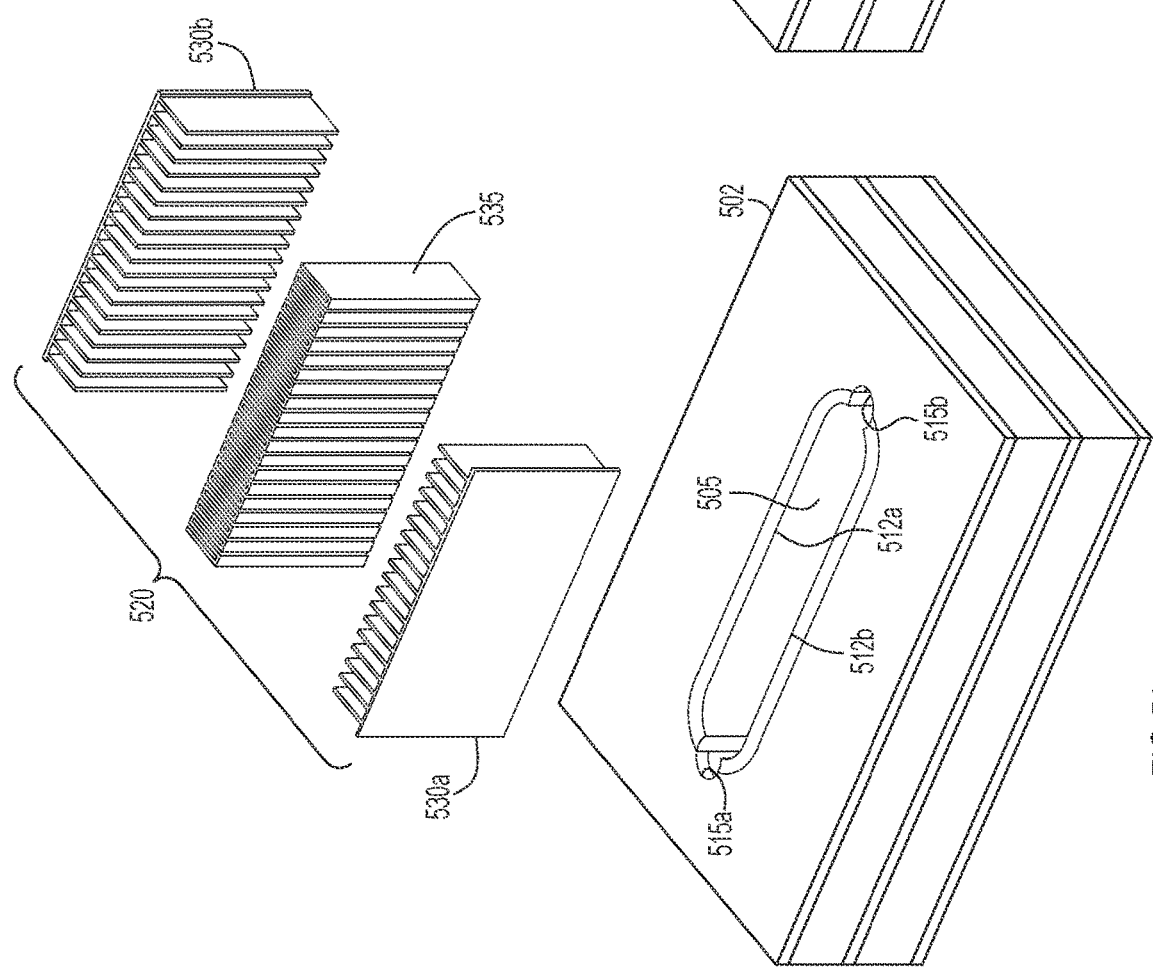
FIG.5A
FIG.5B

CAVITY BASED POWER DELIVERY AND DECOUPLING

CROSS REFERENCE TO RELATED APPLICATIONS

This application claims priority to U.S. Provisional Application No. 63/349,690 filed on Jun. 7, 2022 and entitled "SLOT TRENCH BASED POWER DELIVERY AND DECOUPLING," the contents of which are hereby incorporated by reference in their entirety.

TECHNICAL FIELD

The present disclosure relates to semiconductor fabrication.

BACKGROUND

Future high bandwidth Application Specific Integrated Circuits (ASICs), Central Processing Units (CPUs), and General Processing Units (GPUs), among others, may require high current delivery into the ASIC pin field. During the design phase of such devices, one must manage several aspects, including voltage drop, current density, temperature, and others, to ensure sufficient performance.

Voltage drop impacts timing and performance, with reduced power efficiency and dissipation of power into heat. High current density and temperature impacts the long-term reliability due to electromigration. Higher temperature of the printed circuit board (PCB) causes additional loss to the high-speed networks. The ability to decrease voltage drop, current density and thermal rise has multiple benefits including power consumption, reliability, and cost.

Current processing unit designs may include many high frequency alternating current (AC) capacitors that are placed either on the top of the PCB or under the device on the backside of the PCB. The connections to the AC capacitors are inductive which leads to limited performance bandwidth and the need for more capacitors.

BRIEF DESCRIPTION OF THE DRAWINGS

FIGS. 5A-5D illustrate a process for arranging a capacitor within an elongated cavity using the techniques disclosed herein, according to an example embodiment.

DETAILED DESCRIPTION

Overview

Figure 1:
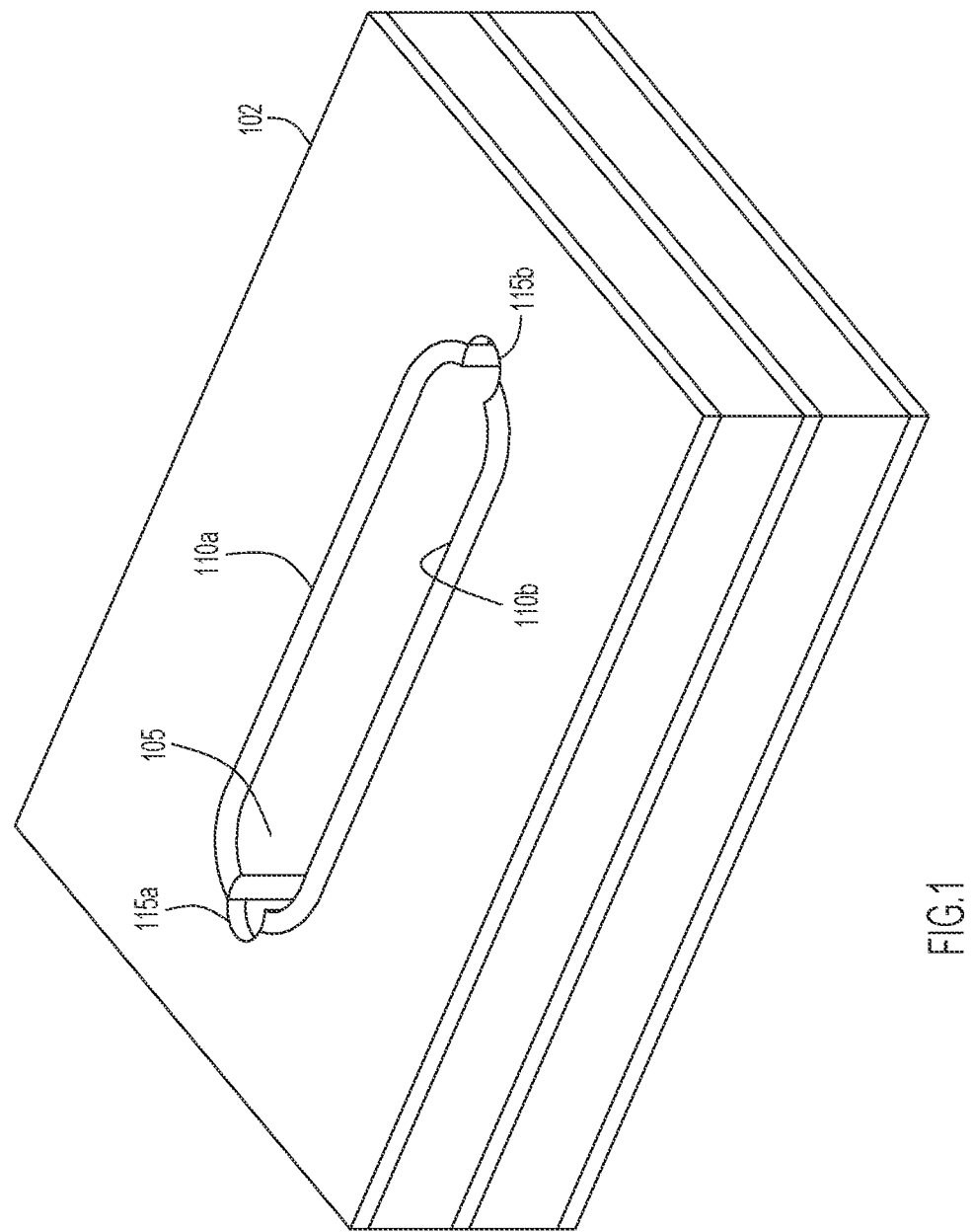
FIG. 1 is a perspective views of a first structure that includes an elongated cavity constructed using the techniques disclosed herein, according to an example embodiment.

In some aspects, the techniques described herein relate to an apparatus including: a support structure of an integrated circuit device; and an elongated cavity formed in the support structure of the integrated circuit device, wherein an interior of the elongated cavity is plated with a conductive material separated into a first power connection portion and a first ground connection portion.

According to other aspects, the techniques described herein relate to an apparatus including: a first circuit board in which an elongated cavity is formed, wherein an interior of the elongated cavity is plated with a conductive material separated into a female power connection portion and a female ground connection portion; and a second circuit board on which a connector is formed, wherein the connector protrudes from the second circuit board and includes a male power connection portion, a male ground connection portion and an insulating material arranged between the male power connection portion and the male ground connection portion, wherein the connector is arranged within the elongated cavity to secure the first circuit board to the second circuit board and forms a first electrical connection between the female power connection portion and the male power connection portion and a second electrical connection between the female ground connection portion and the male ground connection portion.

The techniques described herein also relate to a method including: forming an elongated cavity in a support structure of an integrated circuit device; plating an interior of the elongated cavity with a conductive material; and forming a first bore and a second bore in the conductive material to separate the conductive material into a first power connection portion and a first ground connection portion.

Example Embodiments

According to embodiments presented herein, elongated cavity technology (also referred to herein as slot trench technology) is used for high-speed interconnections in integrated circuit devices that may provide for improved power delivery. Specifically, an elongated cavity structure (also referred to herein as a slot trench structure) may be modified to enable improved power delivery when compared to vias. The use of highly plated vertical planes within the elongated cavity or slot trench may facilitate the improved power delivery. The elongated cavity structure opening may also provide for heavier conductive plating (e.g., copper plating) which may be used to provide better power delivery, such as power delivery at higher voltages, with higher current, with lower current density, with lower resistance, or other benefits that will be apparent to the skilled artisan from the following description. Additionally, the elongated cavity/slot trench techniques disclosed herein may be applied to different aspects of integrated circuit devices. For example, the disclosed elongated cavity structures may be formed in a number of different integrated circuits or support structures of integrated circuit devices, such as printed circuit boards (PCBs), integrated circuit packaging material, and/or others known to the skilled artisan.

With reference now made to FIG. 1, depicted therein is an elongated cavity or slot trench 105 formed in a support structure 102 of a processor or another integrated circuit device. According to the specific embodiments of FIG. 1, elongated cavity 105 is formed in a PCB, but support structure 102 may be embodied as another structure, as noted above. Elongated cavity 105 is provided with an elongated shape, specifically the shape of a geometric stadium, with a length-to-width aspect ratio of greater than one. Other example shapes for elongated cavity 105, including "plus" or "X" shapes, "T" shapes, "L" shapes and "I" shapes, are described below with reference to FIGS. 6A-6D. Elongated cavity 105 includes plating 110a/110b, which is divided into two separate plating planes 110a and 110b by bores 115a and 115b. Bores 115a and 115b allow plating planes 110a and 110b to provide different electrical signals, to be maintained at different electrical potentials, or to provide different electrical currents. For example, plating plane 110a may provide a power connection with plating plane 110b providing a ground connection. The power connection provided by plating plane 110a may be a positive or negative voltage utilized by a source or a drain of a bipolar or MOSFET transistor. Other example embodiment elongated cavities 105 may omit bores 115a and 115a, thereby providing a single plating plane, without deviating from the disclosed elongated cavity/slot trench techniques.

Plating 110a/110b is provided with a thickness of approximately 3 mil (approximately inches or 0.76 mm). Plating of this thickness may be facilitated by the large opening provided by elongated cavity 105. Plating of this thickness may allow for better power delivery by plating planes 110a and 110b. For example, traditional vias may be configured with 1 mil plating. The 3 mil thickness of plating 110a/110b allows for significantly decreased current density when compared with power delivery by related art vias. Consider, for example, a via with a drilled hole size (dhs) diameter of 8 mil and a finished hole size (fhs) diameter of 6 mil. A via with these dimensions may result in a plating cross-sectional area of approximately 21.98 mil$^2$ (i.e., the area of the fhs subtracted from the area of the dhs). An elongated cavity/slot trench as illustrated in FIG. 1, with a drilled diameter of 8 mil, a plating thickness of 3 mil, and a length of mil results in a plating cross-sectional area of approximately 180 mil$^2$ for each of plating planes 110a and 110b. Assuming four vias can be arranged in the same footprint as one slot trench, and a current of 500 A, using cavities/slot trenches like elongated cavity 105 in place of vias may be provide similar power delivery with approximately half the current density. For example, using 500 vias as described above will result in a current density of approximately 45.5 mA/mil$^2$ while 125 cavities/slot trenches as described above will result in a current density of approximately 22.2 mA/mil$^2$.

Figure 2:
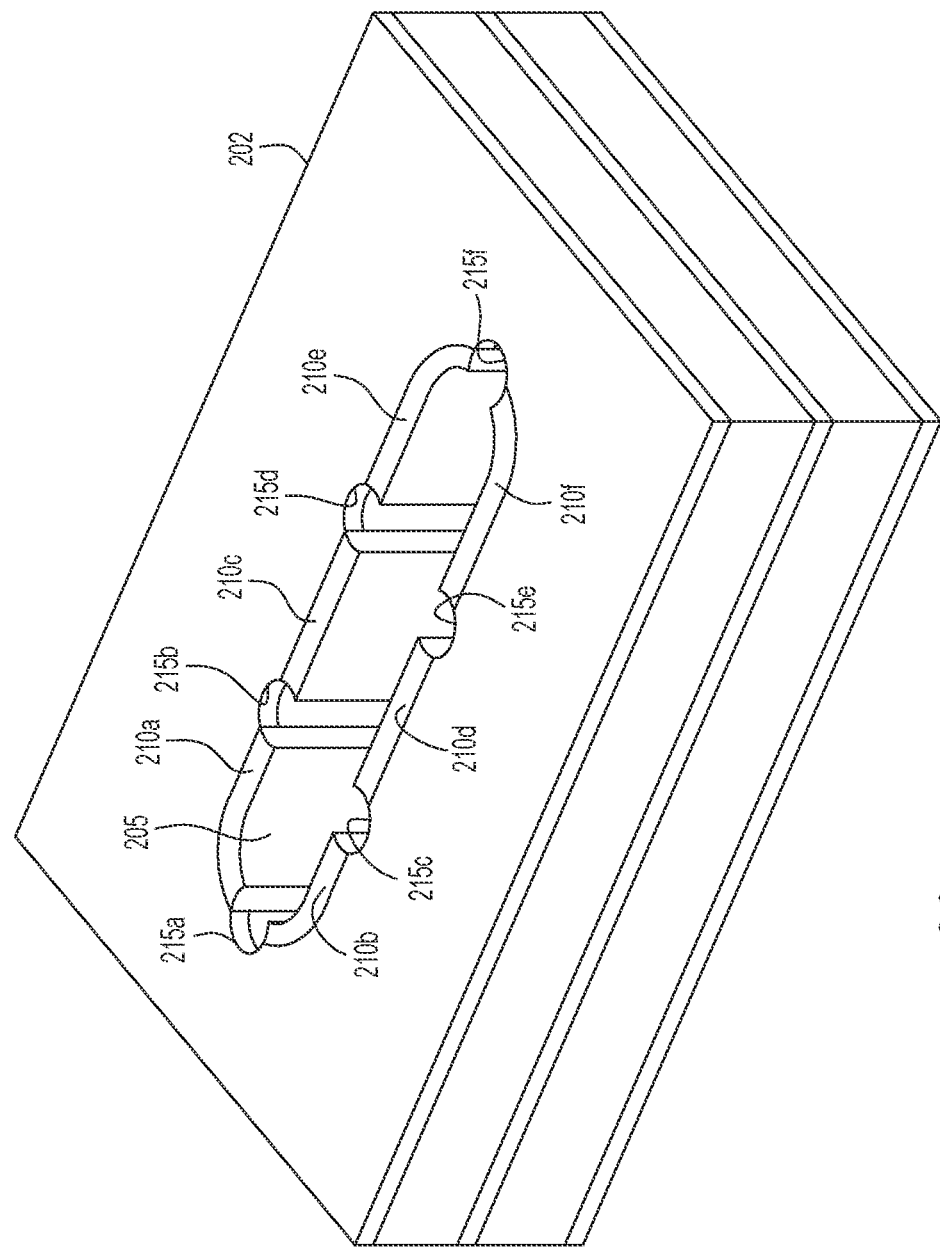
FIG. 2 is a perspective views of a second structure that includes an elongated cavity constructed using the techniques disclosed herein, according to an example embodiment.

With reference now made to FIG. 2, depicted therein is an elongated cavity 205 formed in a support structure 202 of a processor or another integrated circuit device. Elongated cavity 205 is similar to elongated cavity 105 of FIG. 1, but elongated cavity 205 includes six bores 215a, 215b, 215c, 215d, 215e, 215f (215a-f), which divide the conductive plating into six plating planes 210a-f. According to certain example embodiments, plating planes 210a-f may form separate pairs of power delivery and ground connections. For example, plating plane 210a may provide a first power connection with a corresponding ground connection provided by plating plane 210b. Similar power and ground connection pairs may be formed by plating planes 210c and 210d and plating planes 210e and 210f, respectively. According to other example embodiments, one or more of plating planes 210a-f may be utilized to provide a signaling connection through support structure 202. According to still other example embodiments, a subset set of plating planes 210a-f may be utilized to provide a combination of power and signaling connections through support structure 202.

Figure 3A:
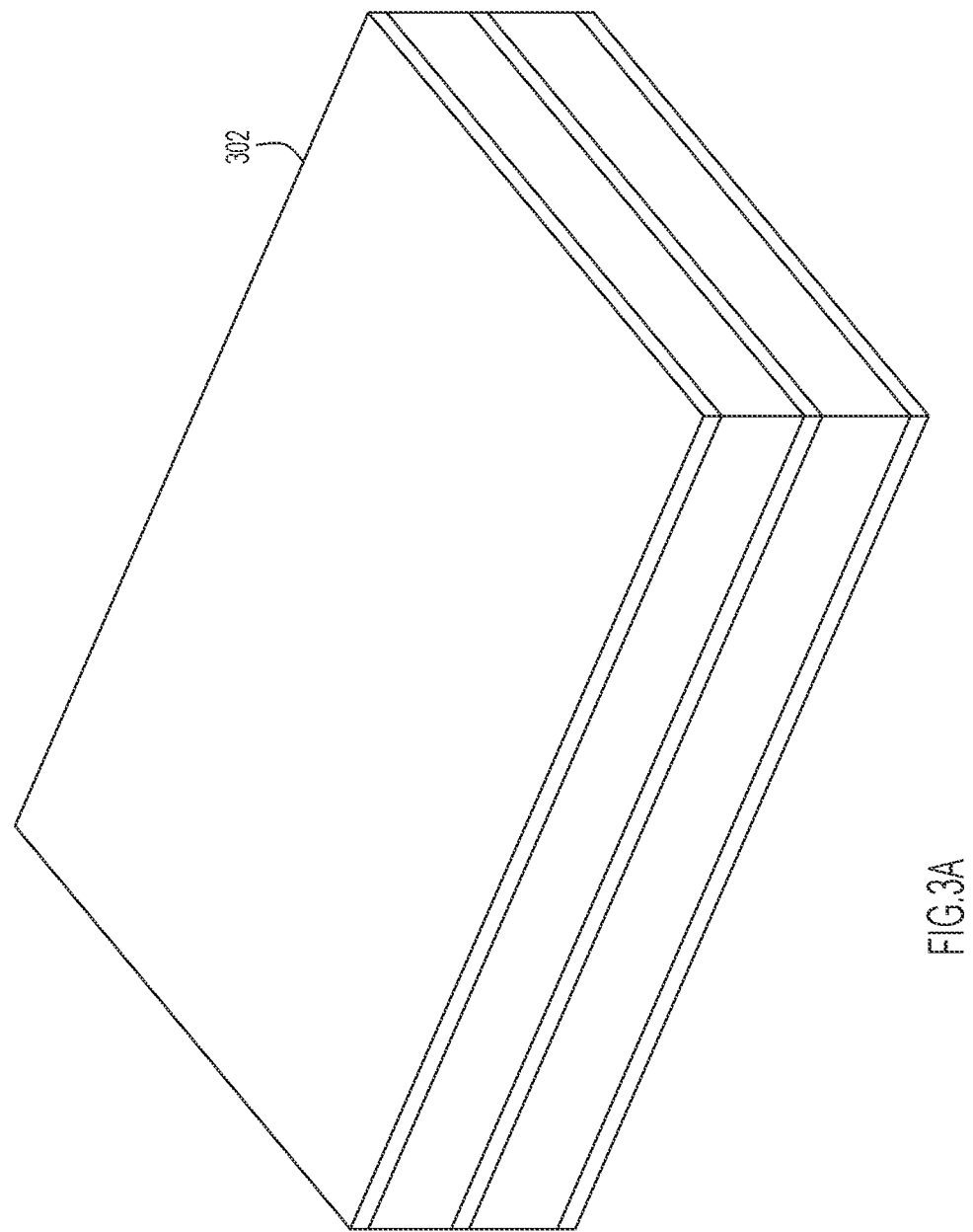
FIGS. 3A-3G illustrate a process for forming an elongated cavity using the techniques disclosed herein, according to an example embodiment.
Figure 3C:
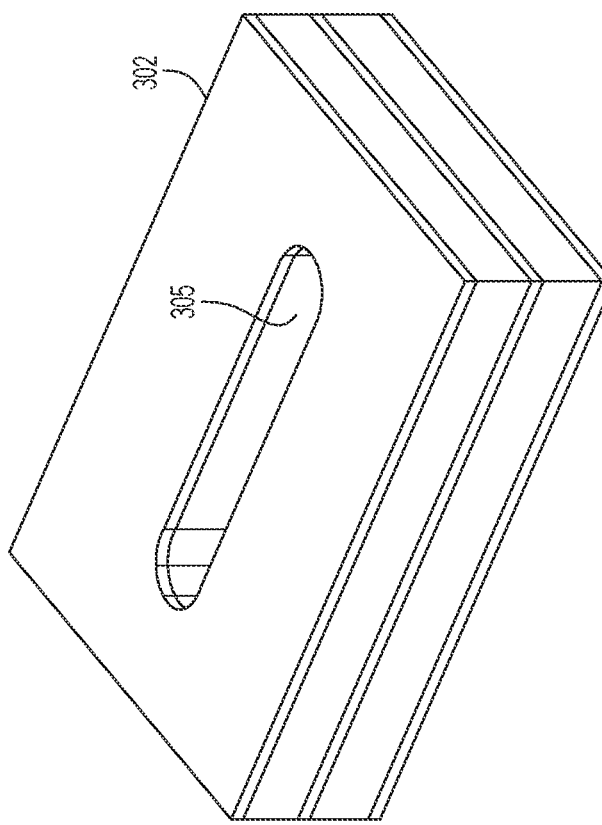
Figure 3B:
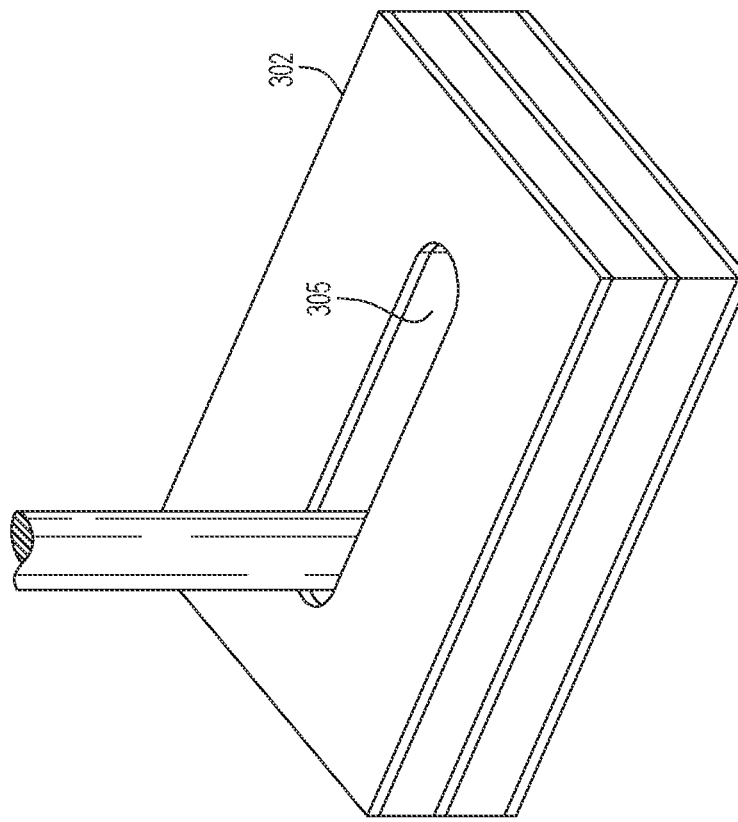
Figure 3E:
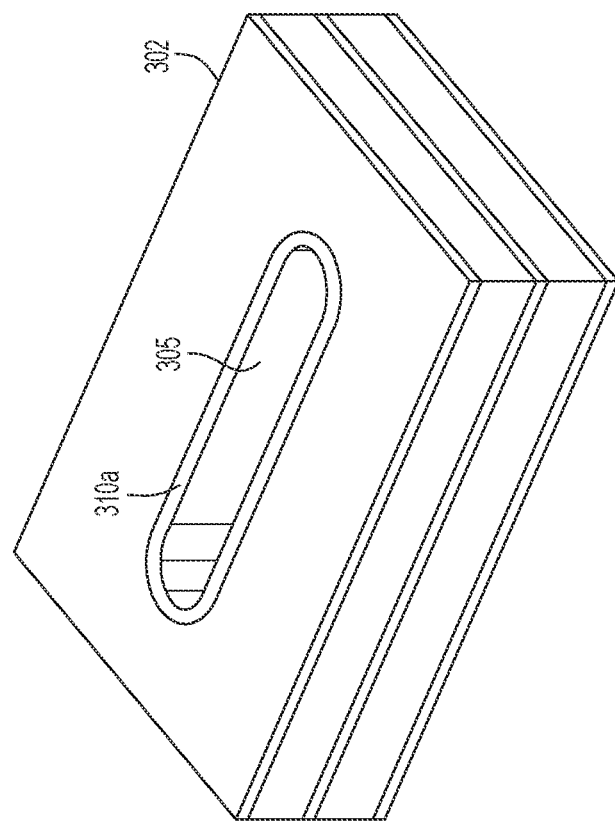
Figure 3D:
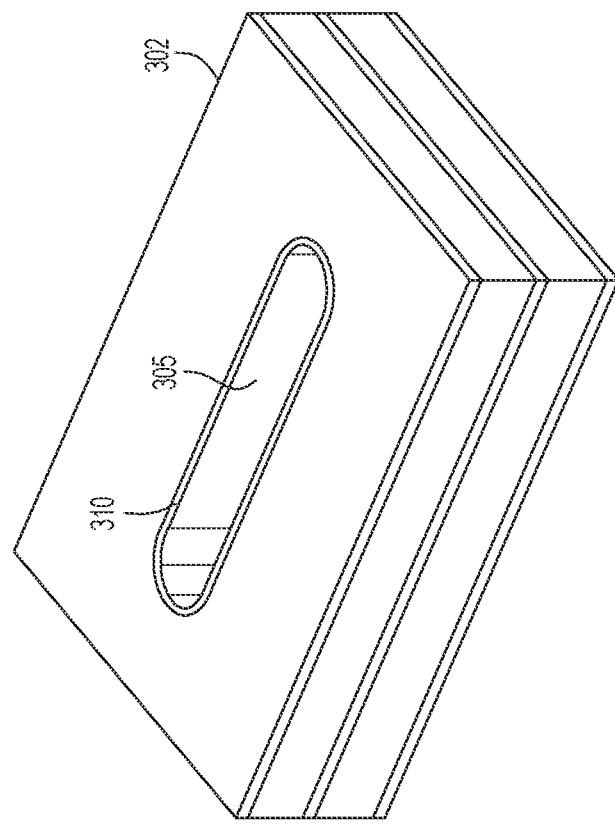
Figure 3G:
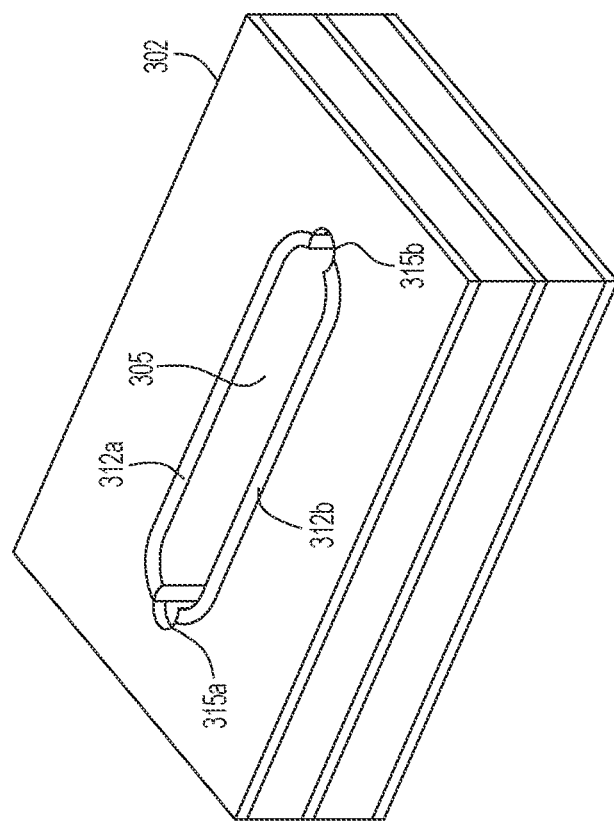
Figure 3F:
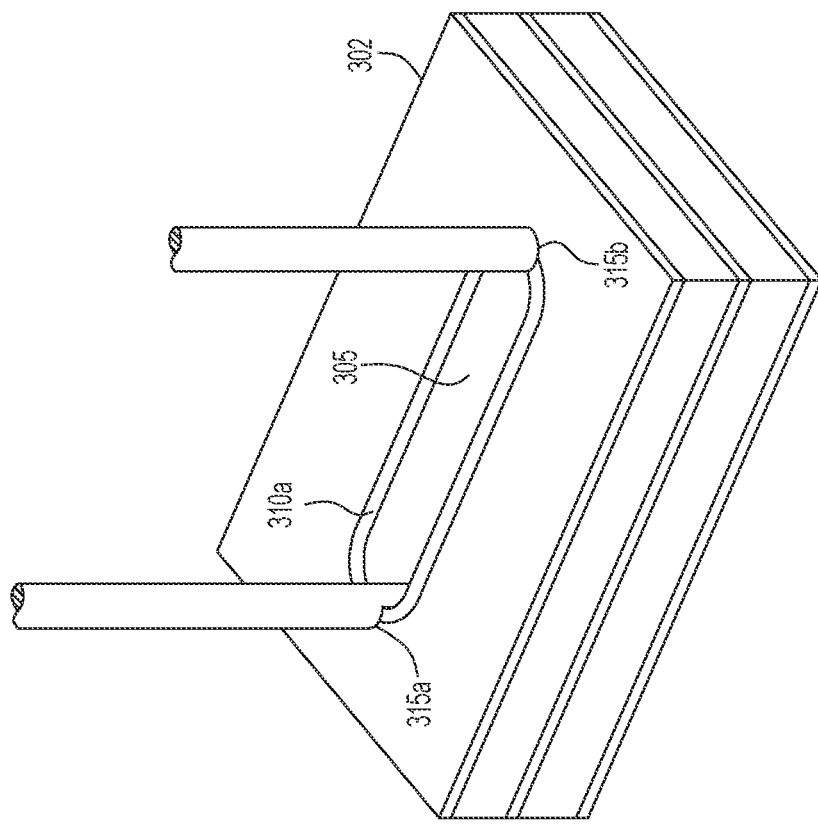

With reference now made to FIGS. 3A-3G, depicted therein is a process flow for forming elongated cavities/slot trenches in a support structure for an integrated circuit device in accordance with the techniques disclosed herein. As illustrated in FIG. 3A, the process of forming an elongated cavity begins when a support structure 302 is provided. Next, as illustrated in FIG. 3B, a cavity is drilled in support structure 302 with an appropriate size and shape. As illustrated in FIG. 3C, elongated cavity 305 is formed having the shape of a geometric stadium. Though, as described in detail below with reference to FIGS. 6A-6D, the elongated cavity/slot trench techniques disclosed herein may use different shapes. Next, as shown in FIG. 3D, the interior of elongated cavity 305 is plated with conductive plating 310. The plating may be comprised of copper or another conductive material that is capable of forming the power and signaling connections disclosed herein. As illustrated in FIG. 3D, the plating may be formed with a smaller thickness, such as a 1 mil thickness, or with a larger thickness, such as a 3 mil thickness, as illustrated through thick metal plating 310a in FIG. 3E. Next, as illustrated in FIG. 3F, bores 315a and 315b are optionally formed in conductive plating 310a. As shown in FIG. 3F, a drilling process may be used to drill through thick metal plating 310a. Once formed, bores 315a and 315b separate the conductive plating into plating planes 312a and 312b. If elongated cavity 305 is being formed with a single plating plane, the formation of bores 315a and 315b may be omitted. As discussed above, additional bores may be formed in the conductive plating 310 to separate the conductive plating into a greater number of plating planes to provide a greater number of power and/or signaling connections through support structure 302. It is also possible to form bores 315a and 315b through a different process than the drilling illustrated in FIG. 3F. For example, bores 315a and 315b may be formed during the plating illustrated in FIGS. 3D and 3E by masking or otherwise preventing conductive material from plating the interior of elongated cavity 305 in the locations of bores 315a and 315b.

Figure 4:
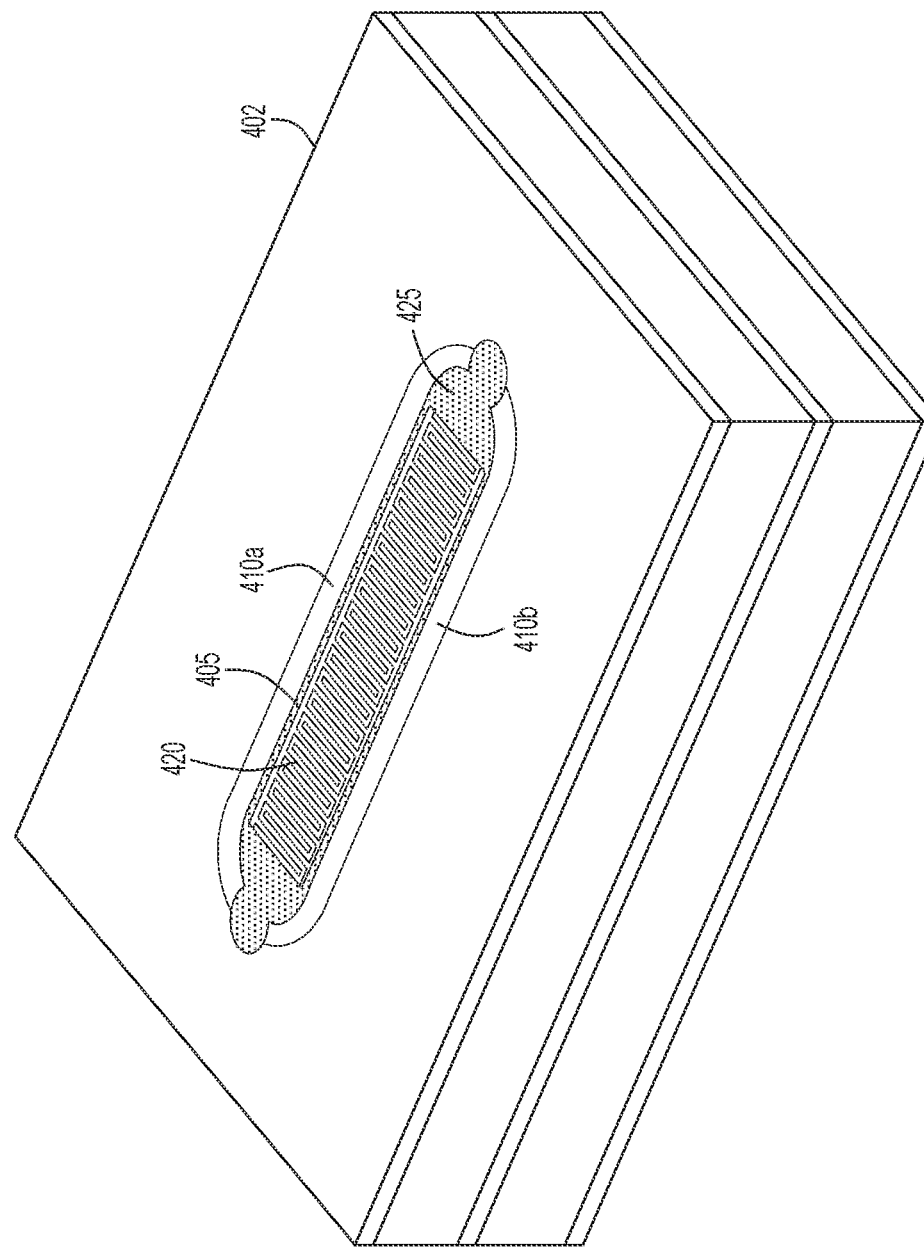
FIG. 4 is a perspective views of a third structure that includes an elongated cavity constructed using the techniques disclosed herein into which a capacitor is arranged, according to an example embodiment.

In addition to providing the above-described features and benefits, the elongated cavity/slot trench techniques disclosed herein also allow for improved alternating current decoupling between signaling and power connections. As will now be described with reference to FIG. 4, the large opening size provided by elongated cavity 405 in support structure 402 allows for the arrangement of a capacitor 420 directly within elongated cavity 405. By placing capacitor 420 within elongated cavity 405 and filling elongated cavity 405 with resin 425, plating plane 410a may be decoupled from plating plane 410b such that a mounting inductance is reduced by up to 10 times that achieved by related art techniques using vias. Specifically, and as discussed above, one elongated cavity 405 has a similar footprint to four vias. Accordingly, 500 vias are needed to provide the equivalent connections provided by 125 elongated cavities 405. Assuming a via inductance of $2.88 \times 10^{-9}$ H, an Equivalent Series Inductance (ESL) for 500 vias would amount to $5.76 \times 10^{-12}$ H. The capacitors connected to the vias also provide an ESL such that 500 capacitors provide an ESL of $2.0 \times 10^{-13}$ H.

Therefore, the total ESL for the via implementation (i.e., the ESL from the vias plus the ESL from the capacitors) would be $5.96 \times 10^{-12}$ H. On the other hand, assuming a $5.0 \times 10^{-11}$ H ESL per elongated cavity 405 with an accompanying capacitor 420, the total ESL for 125 elongated cavities 405 amounts to $4.00 \times 10^{-13}$ H, an approximately 10 times improvement over the ESL for the equivalent via connections. Additionally, arranging capacitors 420 within elongated cavity 405 decouples the support structure 402 and has the added benefit of not taking up space underneath support structure 402 with capacitors.

Figure 5D:
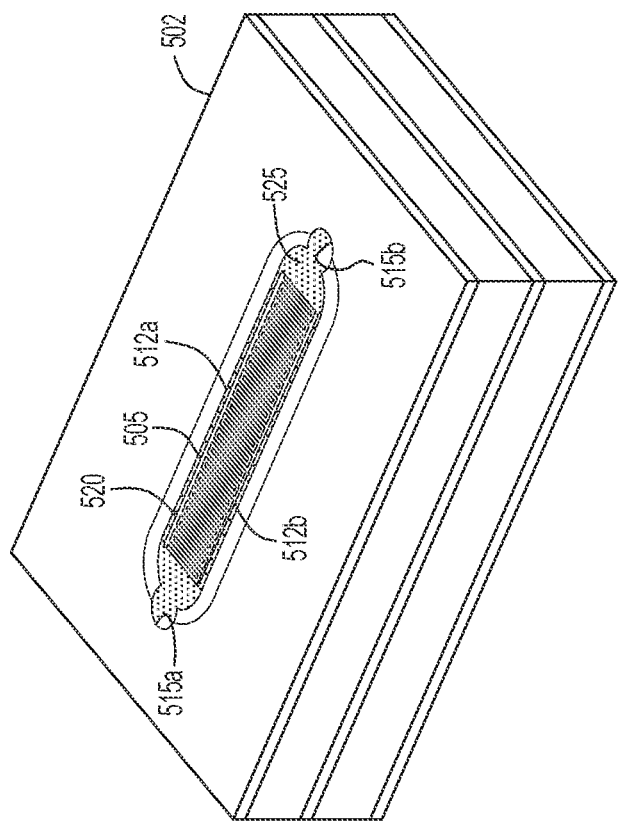
Figure 5C:
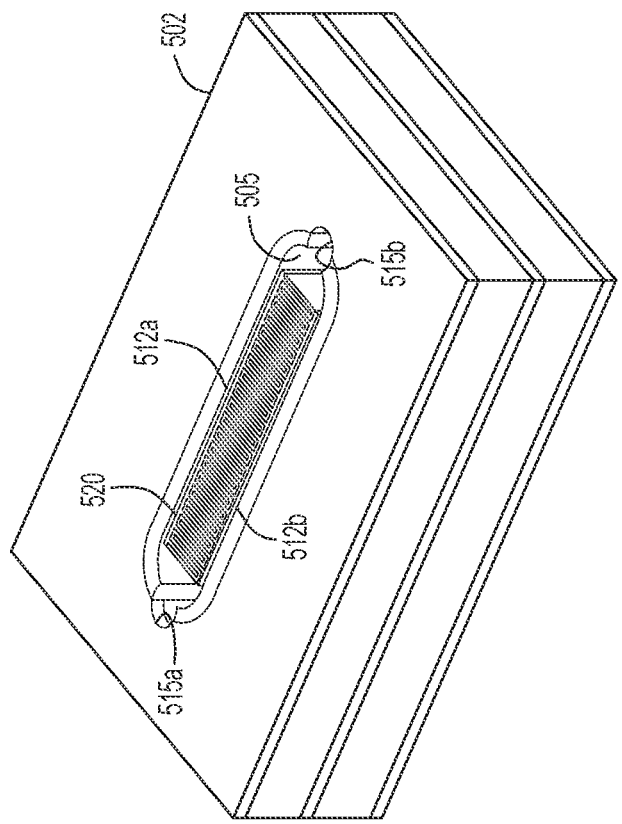

An example process for providing a capacitor in an elongated cavity will now be described with reference to FIGS. 5A-5D. This process may begin upon completion of the process illustrated with reference to FIGS. 3A-3G. Accordingly, FIG. 5A illustrates an elongated cavity 505 formed in support structure 502 using a process analogous to that illustrated in FIGS. 3A-3G. Therefore, support structure 502 includes elongated cavity 505, plating planes 512a and 512b, and bores 515a and 515b. FIG. 5A also illustrates the formation of capacitor 520 by which a first metal plate 530a and a second metal plate 530b are arranged with a material having a high dielectric constant. Once combined, capacitor 520 is formed such that the high dielectric material 535 fills the space between the first metal plate 530a and the second metal plate 530b, as illustrated in FIG. Additionally, capacitor 520 is arranged such that it may fit within elongated cavity 505. While FIGS. 5A and 5B illustrate capacitor 520 being formed after the elongated cavity 505 is formed in support structure 502, capacitor 520 may be formed before, after, or concurrently with elongated cavity 505 without deviating from the disclosed techniques. Once formed, capacitor 520 is arranged within elongated cavity 505, as illustrated in FIGS. 5B and 5C, and secured with resin 525 as illustrated in FIG. 5D.

Figure 6A:
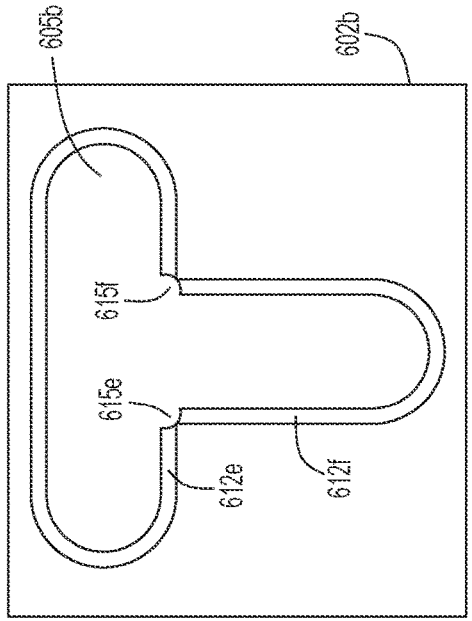
FIGS. 6A-6D are plan views of elongated cavity shapes that may be formed in support structures of integrated circuit devices, according to example embodiments.
Figure 6B:
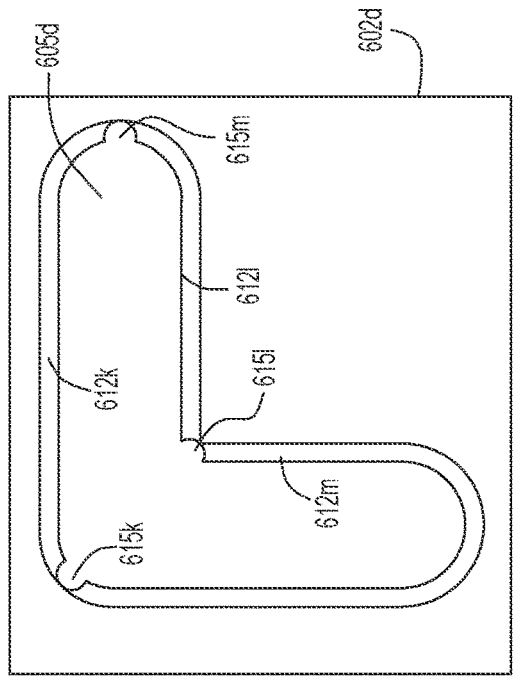
Figure 6C:
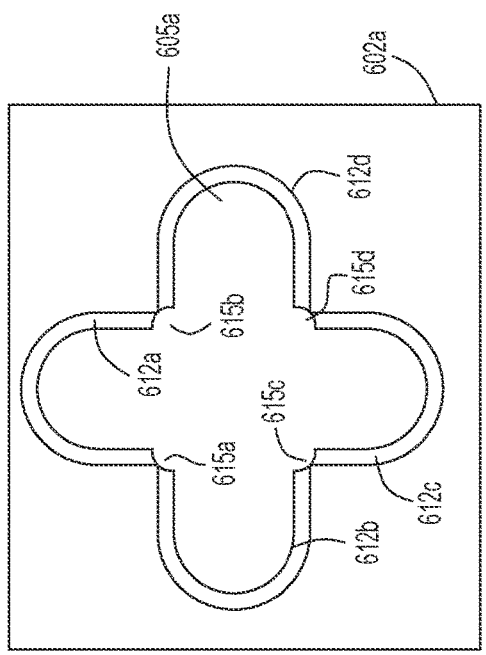
Figure 6D:
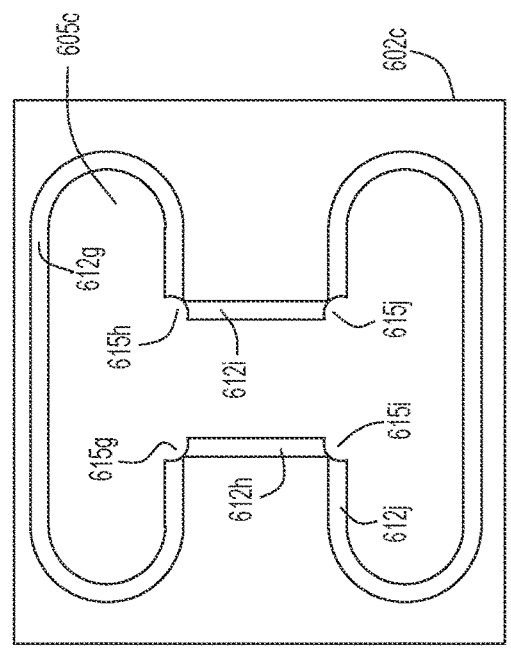

As noted above, the elongated cavity/slot trench techniques disclosed herein provide for elongated cavities of different shapes, as illustrated in FIGS. 6A-6D. As illustrated, elongated cavities 605a-d can be formed in support structures 602a, 602b, 602c, 602d (602a-d) in many different shapes, including "plus or "X" shapes (FIG. 6A), "T" shapes (FIG. 6B), "I" shapes (FIG. 6C) and "L" shapes (FIG. 6D). Elongated Cavities 605a-d are just a sampling of shapes, and the skilled artisan understands that additional shapes are also possible without deviating from the disclosed techniques, such as "W" shapes, "N" Shapes, "E" shapes, "F" shapes, and "Z" shapes, among others. As illustrated in FIGS. 6A-6D, elongated cavities 605a-d may be separated into plating planes 612a-612m using bores 615a-615m. Specifically, elongated cavity 605a of FIG. 6A is formed with four plating planes 612a-d using bores 615a-615d, elongated cavity 605b of FIG. 6B is formed with two plating planes 612e and 612f using bores 615e and 615f, elongated cavity 605c of FIG. 6C is formed with four plating planes 612g-j using bores 615g-615j, and elongated cavity 605d of FIG. 6D is formed with three plating planes 612k-m using bores 615k-615m. Each of the shapes illustrated in FIGS. 6A-D, as well as the other shapes known to the skilled artisan, may be formed with more or fewer plating plans using more or fewer bores.

Figure 7:
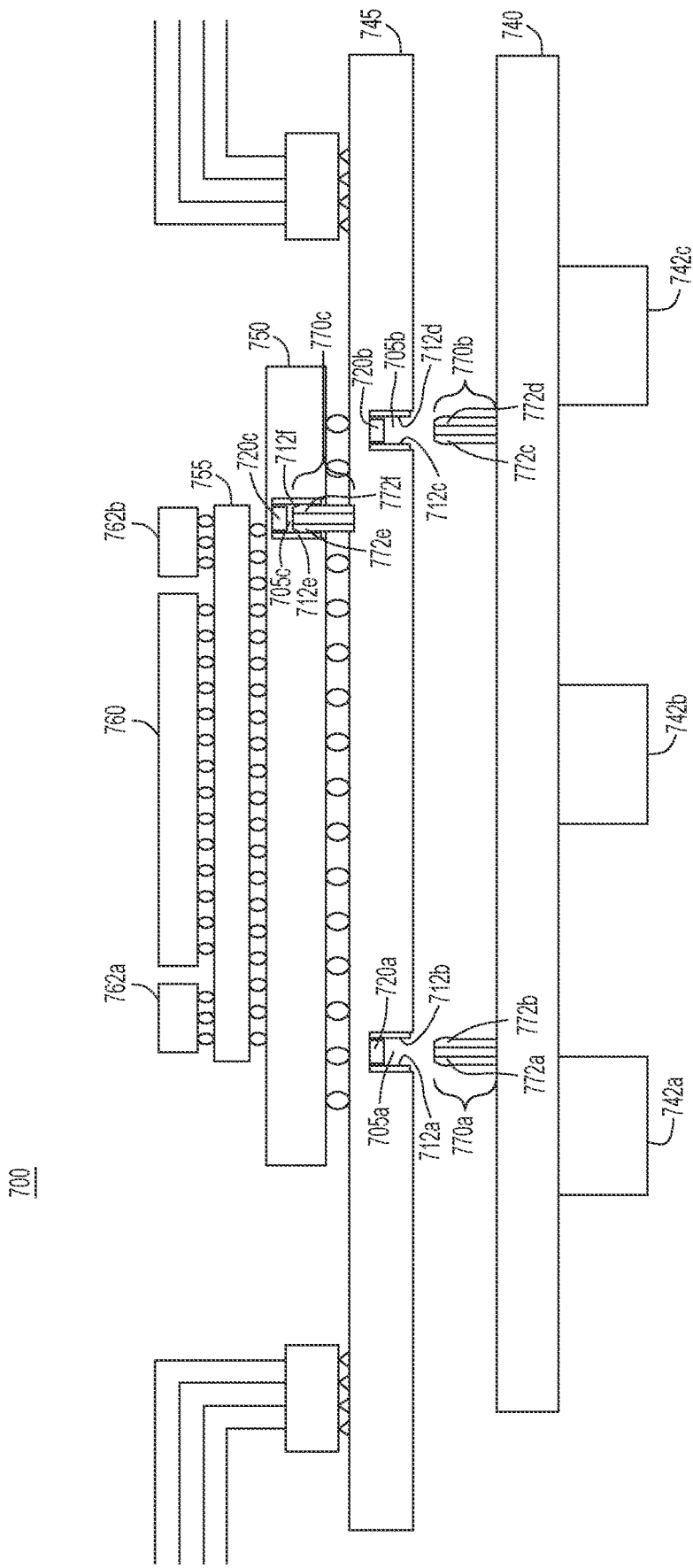
FIG. 7 is a side sectional view of a high-speed interconnect and a signaling connection fabricated using the elongated cavity techniques of the present disclosure, according to an example embodiment.

With reference now made to FIG. 7, illustrated therein are implementations of the disclosed elongated cavity/slot trench techniques to supply power from a power delivery PCB 740 to a high speed PCB 745 of a processor device 700. FIG. 7 also illustrates the use of the disclosed elongated cavity/slot trench techniques to provide signaling connections between high speed PCB 745 and package 750.

As illustrated in FIG. 7, voltage regulator modules (VRMs) 742a, 742b, 742c (742a-c) convert the output from a computer power supply (e.g., 12 V power) to a lower voltage (e.g., voltage ranging anywhere from 1.1 V to 3.3 V) for use by processor device 700. Power delivery PCB 740 delivers this lower voltage power to high speed PCB 745 using the disclosed elongated cavity/slot trench technology. Specifically, elongated cavities 705a and 705b are formed in high speed PCB 745. Elongated cavities 705a and 705b are formed with plating planes 712a and 712b and plating planes 712c and 712d, respectively. Elongated cavities 705a and 705a are each provided with a capacitor, capacitors 720a and 720b, respectively. Power delivery PCB 740 is provided with connectors 770a and 770b, which will be described in greater detail below with respect to FIG. 8. Briefly, connector 770a is provided with connection conductors 772a and 772b, which are configured to engage with plating planes 712a and 712b of elongated cavity 705a, respectively. Connection conductor 772a provides power to plating plane 712a and connection conductor 772b provides grounding to plating plane 712b. Connector 770b includes analogous connection conductors 772c and 772d, which are configured to engage with plating planes 712c and 712d of elongated cavity 705b, respectively. Through the use of elongated cavities 705a and 705b and connectors 770a and 770b, a high speed interconnect is formed between power delivery PCB 740 and high speed PCB 745. This high speed interconnect allows the power delivery PCB 740 and high speed PCB 745 to be formed separately. Separating these two boards can improve cost, yield and reliability as separating the boards allows the power delivery PCB 740 to be constructed using low-cost materials. In addition to power delivery, elongated cavities 705a and 705b and connectors 770a and 770b may be used to provide signaling between power delivery PCB 740 and high speed PCB 745.

Also illustrated in FIG. 7 is elongated cavity 705c formed in package 750, which is configured to engage with connector 770c of high speed PCB 745. Elongated cavity 705c also includes capacitor 720c. Connector 770c is configured to engage with elongated cavity 705c, forming connections between plating planes 712e and 712f and connection conductors 772e and 772f. These connections may be used to provide power, ground and/or signaling connections between high speed PCB 745 and package 750. The elongated cavity/slot trench techniques of this disclosure may also be used to form connections between package 750 and interposer 755, as well as between interposer 755 and one or more of die 760 and chiplets 762a and 762b.

Figure 8:
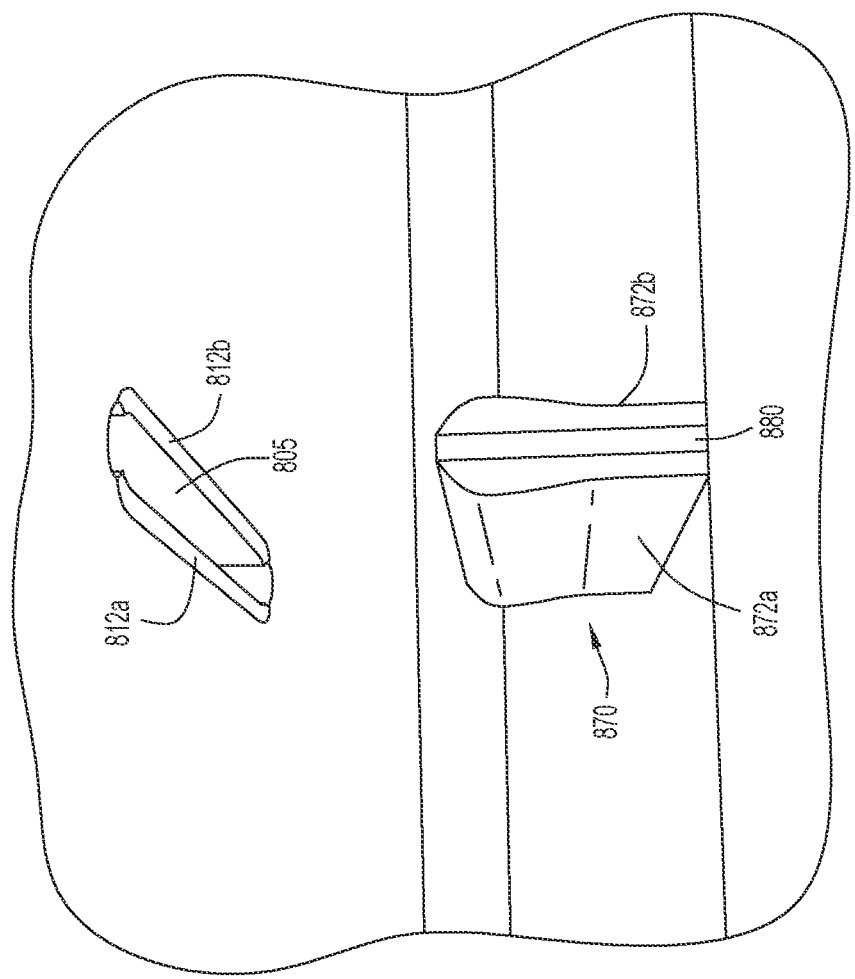
FIG. 8 is a perspective view of a connector configured to form electrical connections by engaging with elongated cavities constructed according to the disclosed techniques, according to an example embodiment.

With reference now made to FIG. 8, depicted therein is a close-up perspective view of connector 870, which is analogous in structure to connectors 770a-c of FIG. 7. Connector 870 includes a first connection conductor 872a and a second connection conductor 872b. Arranged between first connection conductor 872a and second connection conductor 872b is insulating material 880. Insulating material 880 ensures that first connection conductor 872a and second connection conductor 872b remain electrically isolated. Connector 870 is shaped so that it engages with elongated cavity 805 and insulating material 880 is arranged within connector 870 so that connection conductors 872a and 872b connect with plating planes 812a and 812b, respectively. If elongated cavity 805 is formed in another shape (e.g., as described above with reference to FIGS. 6A-6D), connector 870 would be formed with a correspondingly different shape. If elongated cavity 805 is formed with more or fewer plating planes, insulating material 880 would be arranged within connector 870 to form more or fewer connection conductors within connector 870.

Figure 9C:
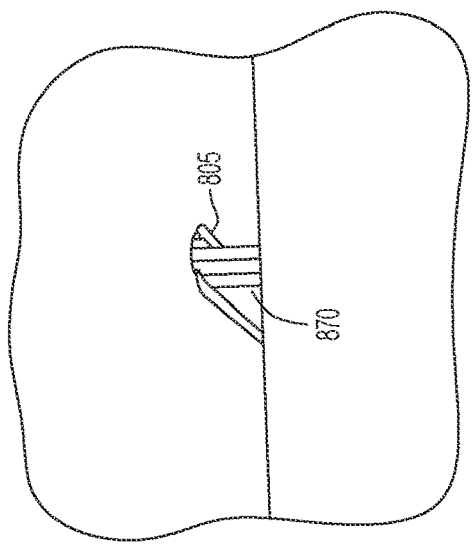
FIGS. 9A-9C illustrate a process for electrically connecting a connector as illustrated in FIG. 8 with an elongated cavity constructed according to the disclosed techniques, according to an example embodiment.
Figure 9B:
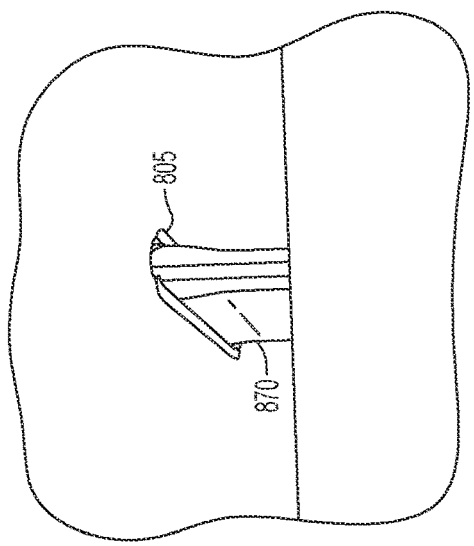
Figure 9A:
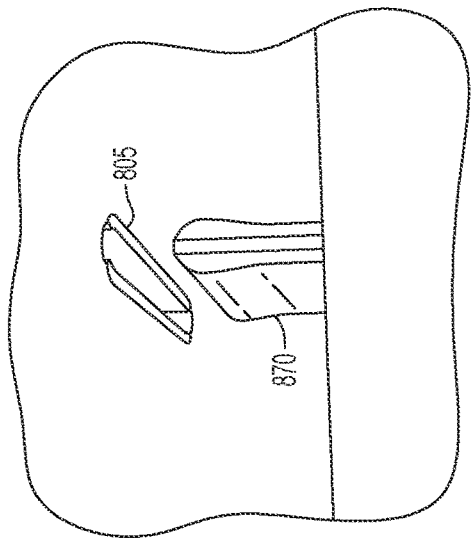

Connector 870 is formed with a generally oblanceolate cross-section—i.e., it is wider at the top than it is at the bottom. This generally oblanceolate cross section allows connector 870 to securely engage with elongated cavity 805. For example, the shape of connector 870 may facilitate a snap-fit, friction-fit or press-fit engagement between connector 870 and elongated cavity 805. Accordingly, to assemble a structure utilizing elongated cavities 805 and connectors 870, a support structure in which elongated cavities 805 are formed may be pressed onto a support structure on which connectors 870 are formed, as illustrated in FIGS. 9A-9C.

The solution presented herein may achieve improved DC power delivery, lower thermal rise, better long-term reliability and lower impact on high-speed performance due to reduced thermal degradation of inductance. The disclosed techniques also provide for the ability to support multiple power rails within a single elongated cavity/slot trench structure.

Improved AC performance can be achieved by significantly reducing the mounting inductance. The disclosed techniques may also provide for lower costs as fewer parts are needed to achieve the same power delivery network or power distribution network (PDN) performance. The disclosed techniques also provide for placement of embedded capacitors close to the ASIC, inside the elongated cavity/slot trench.

A built-in connector feature as disclosed herein may enable the high-speed board to connect to the power board. Separating the two PCBs may reduce integration costs, may achieve higher manufacturing yield, and may lower thermal impact from thermal rise on high-speed nets.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of can be represented using the'(s)' nomenclature (e.g., one or more element(s)).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

In summary, the techniques described herein relate to an apparatus including: a support structure of an integrated circuit device; and an elongated cavity formed in the support structure of the integrated circuit device, wherein an interior of the elongated cavity is plated with a conductive material separated into a first power connection portion and a first ground connection portion.

In some aspects, the techniques described herein relate to an apparatus, wherein the support structure of the integrated circuit device includes a printed circuit board material.

In some aspects, the techniques described herein relate to an apparatus, wherein the support structure of the integrated circuit device includes a processor packaging material.

In some aspects, the techniques described herein relate to an apparatus, wherein the conductive material has a thickness of greater than 1 mil.

In some aspects, the techniques described herein relate to an apparatus, wherein the conductive material has a thickness of approximately 3 mil.

In some aspects, the techniques described herein relate to an apparatus, further including a capacitor arranged within the elongated cavity.

In some aspects, the techniques described herein relate to an apparatus, wherein the capacitor is secured within the elongated cavity using resin.

In some aspects, the techniques described herein relate to an apparatus, wherein the conductive material is further separated into a second power connection portion and a second ground connection portion.

In some aspects, the techniques described herein relate to an apparatus, wherein the conductive material is further separated into a signaling connection portion.

In some aspects, the techniques described herein relate to an apparatus including: a first circuit board in which an elongated cavity is formed, wherein an interior of the elongated cavity is plated with a conductive material separated into a female power connection portion and a female ground connection portion; and a second circuit board on which a connector is formed, wherein the connector protrudes from the second circuit board and includes a male power connection portion, a male ground connection portion and an insulating material arranged between the male power connection portion and the male ground connection portion, wherein the connector is arranged within the elongated cavity to secure the first circuit board to the second circuit board and forms a first electrical connection between the female power connection portion and the male power connection portion and a second electrical connection between the female ground connection portion and the male ground connection portion.

In some aspects, the techniques described herein relate to an apparatus, wherein the first circuit board includes a high speed printed circuit board and wherein the second circuit board includes a power delivery printed circuit board.

In some aspects, the techniques described herein relate to an apparatus, wherein a capacitor is arranged within the elongated cavity.

In some aspects, the techniques described herein relate to an apparatus, wherein the capacitor is secured within the elongated cavity using resin.

In some aspects, the techniques described herein relate to an apparatus, wherein the first circuit board includes a plurality of elongated cavities and the second circuit board includes a plurality of connectors, wherein each of the plurality of connectors is arranged within a respective one of the plurality of elongated cavities.

In some aspects, the techniques described herein relate to an apparatus, further including a voltage regulator module, wherein the voltage regulator module provide power to the first circuit board via the first electrical connection.

In some aspects, the techniques described herein relate to a method including: forming an elongated cavity in a support structure of an integrated circuit device; plating an interior of the elongated cavity with a conductive material; and forming a first bore and a second bore in the conductive material to separate the conductive material into a first power connection portion and a first ground connection portion.

In some aspects, the techniques described herein relate to a method, wherein forming the elongated cavity includes drilling the elongated cavity into the support structure of the integrated circuit device.

In some aspects, the techniques described herein relate to a method, wherein plating the interior the elongated cavity with the conductive material includes plating the interior of the elongated cavity with the conductive material having a thickness of approximately 3 mil.

In some aspects, the techniques described herein relate to a method, wherein forming the first bore and forming the second bore includes drilling through the conductive material at a first location to form the first bore and drilling through the conductive material at a second location to form the second bore.

In some aspects, the techniques described herein relate to a method, further including arranging a capacitor within the elongated cavity.

What is claimed is:

1. An apparatus comprising:
a support structure of an integrated circuit device; and
an elongated cavity formed in the support structure of the integrated circuit device, wherein an interior of the elongated cavity that defines a vertical plating plane that is plated with a conductive material, the conductive material plated on the vertical plating plane defined on the interior of the elongated cavity being separated into at least a first power connection portion and a first ground connection portion by a plurality of bores.

2. The apparatus of claim 1, wherein the support structure of the integrated circuit device comprises a printed circuit board material and the conductive material plated on the vertical plating plane forms a plated vertical plating plane, and wherein the first power connection portion and the first ground connection portion are separated by a first bore of the plurality of bores, the first power connection portion being a first plated plating plane and the first ground connection portion being a second plated plating plane.

3. The apparatus of claim 1, wherein the support structure of the integrated circuit device comprises a processor packaging material.

4. The apparatus of claim 1, wherein the conductive material has a thickness of greater than 1 mil, and wherein the conductive material plated on the vertical plating plane defined on the interior of the elongated cavity is separated into the at least first power connection portion and the first ground connection portion by the plurality of bores by a first bore of the plurality of bores that is not plated with the conductive material.

5. The apparatus of claim 4, wherein the conductive material has a thickness of approximately 3 mil.

6. The apparatus of claim 1, further comprising a capacitor arranged within the elongated cavity, the capacitor having a first metal plate and a second metal plate wherein the elongated cavity has a length-to-width aspect ratio of greater than one, and wherein the first metal plate is arranged in contact with the first power connection portion and the second metal plate is arranged in contact with the first ground connection.

7. The apparatus of claim 6, wherein the capacitor is secured within the elongated cavity using resin, and wherein the elongated cavity has a geometric stadium shape.

8. The apparatus of claim 1, wherein the first power connection portion is separated from the first ground connection portion by a first bore of the plurality of bores, wherein the conductive material plated on the interior of the elongated cavity is further separated into a second power connection portion and a second ground connection portion by a second bore of the plurality of bores, and wherein each of the first power connection portion, the first ground connection portion, the second power connection portion, and the second ground connection portion is a separate plated vertical plating plane formed from the conductive material plated on the interior of the elongated cavity.

9. The apparatus of claim 1, wherein the conductive material plated on the interior of the elongated cavity is further separated into a signaling connection portion, wherein the first power connection portion is a first vertical plating plane, the first ground connection portion is a second vertical plating plane, and the signaling connection portion is a third vertical plating plane, and wherein the first vertical plating plane is separated from the second vertical plating plane.

10. An apparatus comprising:
a first circuit board in which an elongated cavity is formed, wherein an interior of the elongated cavity is plated with a conductive material separated into a female power connection portion and a female ground connection portion; and
a second circuit board on which a connector is formed, wherein the connector protrudes from the second circuit board and includes a male power connection portion, a male ground connection portion and an insulating material arranged between the male power connection portion and the male ground connection portion,
wherein the connector is arranged within the elongated cavity to secure the first circuit board to the second circuit board and forms a first electrical connection between the female power connection portion and the male power connection portion and a second electrical connection between the female ground connection portion and the male ground connection portion.

11. The apparatus of claim 10, wherein the first circuit board comprises a high speed printed circuit board and wherein the second circuit board comprises a power delivery printed circuit board.

12. The apparatus of claim 10, wherein a capacitor is arranged within the elongated cavity.

13. The apparatus of claim 12, wherein the capacitor is secured within the elongated cavity using resin.

14. The apparatus of claim 10, wherein the first circuit board includes a plurality of elongated cavities and the second circuit board includes a plurality of connectors, wherein each of the plurality of connectors is arranged within a respective one of the plurality of elongated cavities.

15. The apparatus of claim 10, further comprising a voltage regulator module, wherein the voltage regulator module provide power to the first circuit board via the first electrical connection.

16. A method comprising:
forming an elongated cavity in a support structure of an integrated circuit device;
plating an interior of the elongated cavity with a conductive material, the interior including a vertical plating plane, wherein plating the interior of the elongated cavity with the conductive material includes plating the vertical plating plane; and
forming a first bore and a second bore in the conductive material plated on the vertical plating plane to separate the conductive material into a first power connection portion and a first ground connection portion, wherein forming the first bore in the conductive material plated on the vertical plating plane removes the conductive material from between the first power connection portion and the first ground connection portion.

17. The method of claim 16, wherein forming the elongated cavity comprises drilling the elongated cavity into the support structure of the integrated circuit device.

18. The method of claim 16, wherein plating the interior the elongated cavity with the conductive material comprises plating the interior of the elongated cavity with the conductive material having a thickness of approximately 3 mil, wherein the first power connection portion has the thickness of approximately 3 mil and the first ground connection portion has the thickness of approximately 3 mil.

19. The method of claim 16, wherein forming the first bore and forming the second bore comprises drilling through the conductive material plated on the interior of the elongated cavity to remove the conductive material plated at a first vertical location of the interior of the elongated cavity to form the first bore and drilling through the conductive material plated on the interior of the elongated cavity to remove the conductive material plated at a second vertical location of the interior of the elongated cavity to form the second bore.

20. The method of claim 16, further comprising arranging a capacitor within the elongated cavity, wherein the elongated cavity has a geometric stadium shape.

* * * * *